United States Patent
Okamoto et al.

(10) Patent No.: US 8,426,895 B2
(45) Date of Patent: Apr. 23, 2013

(54) SEMICONDUCTOR DEVICE AND MANUFACTURING METHOD OF THE SAME

(75) Inventors: Yasuhiro Okamoto, Tokyo (JP); Kazuki Ota, Tokyo (JP); Takashi Inoue, Tokyo (JP); Hironobu Miyamoto, Tokyo (JP); Tatsuo Nakayama, Tokyo (JP); Yuji Ando, Tokyo (JP)

(73) Assignee: NEC Corporation, Tokyo (JP)

( * ) Notice: Subject to any disclaimer, the term of this patent is extended or adjusted under 35 U.S.C. 154(b) by 307 days.

(21) Appl. No.: 12/735,817

(22) PCT Filed: Mar. 23, 2009

(86) PCT No.: PCT/JP2009/055611
§ 371 (c)(1),
(2), (4) Date: Aug. 19, 2010

(87) PCT Pub. No.: WO2009/119479
PCT Pub. Date: Oct. 1, 2009

(65) Prior Publication Data
US 2010/0327318 A1    Dec. 30, 2010

(30) Foreign Application Priority Data
Mar. 24, 2008    (JP) .................................. 2008-076729

(51) Int. Cl.
*H01L 29/205*    (2006.01)
(52) U.S. Cl.
USPC .... 257/219; 257/220; 257/328; 257/E29.262; 438/270
(58) Field of Classification Search ............. 257/219.22, 257/328, 329, E29.262, E29.091
See application file for complete search history.

(56) References Cited

U.S. PATENT DOCUMENTS

| | | | |
|---|---|---|---|
| 4,568,958 A | 2/1986 | Baliga | |
| 6,285,060 B1 | 9/2001 | Korec et al. | |
| 6,312,993 B1 | 11/2001 | Hshieh et al. | |
| 7,592,230 B2 * | 9/2009 | de Fresart et al. | 438/272 |
| 2001/0031551 A1 | 10/2001 | Hshieh et al. | |
| 2001/0032999 A1 | 10/2001 | Yoshida | |
| 2003/0082860 A1 | 5/2003 | Yoshida et al. | |
| 2007/0117355 A1 | 5/2007 | Ueda et al. | |
| 2010/0006894 A1 * | 1/2010 | Ohta et al. | 257/192 |

FOREIGN PATENT DOCUMENTS

| | | |
|---|---|---|
| JP | 60-227476 | 11/1985 |
| JP | 8-264772 | 10/1996 |

(Continued)

OTHER PUBLICATIONS

"GaN-Based Trench Gate Metal Oxide Semiconductor Field Effect Transistors with Over 100 cm2/(V s) Channel Mobility" H.Otake et al. Japanese Journal of Applied Physics, vol. 46, No. 25, 2007, pp. L599-L601.

*Primary Examiner* — Kevin M Picardat
*Assistant Examiner* — Paul Patton
(74) *Attorney, Agent, or Firm* — McGinn IP Law Group, PLLC

(57) ABSTRACT

A semiconductor device capable of suppressing the occurrence of a punch-through phenomenon is provided. A first n-type conductive layer (2') is formed on a substrate (1'). A p-type conductive layer (3') is formed thereon. A second n-type conductive layer (4') is formed thereon. On the under surface of the substrate (1'), there is a drain electrode (13') connected to the first n-type conductive layer (2'). On the upper surface of the substrate (1'), there is a source electrode (11') in ohmic contact with the second n-type conductive layer (4'), and a gate electrode (12') in contact with the first n-type conductive layer (2'), p-type conductive layer (3'), the second n-type conductive layer (4') through an insulation film (21'). The gate electrode (12') and the source electrode (11') are alternately arranged. The p-type conductive layer (3') includes In.

10 Claims, 6 Drawing Sheets

FOREIGN PATENT DOCUMENTS

| | | |
|---|---|---|
| JP | 2001-210822 | 8/2001 |
| JP | 2001-320042 | 11/2001 |
| JP | 2003-163354 | 6/2003 |
| JP | 2004-504711 | 2/2004 |
| JP | 2004-140067 | 5/2004 |
| JP | 2006-32524 | 2/2006 |
| JP | 2006-324279 | 11/2006 |
| JP | 2007-59719 | 3/2007 |
| JP | 2007-134517 | 5/2007 |
| JP | 2007-142243 | 6/2007 |

* cited by examiner

SEMICONDUCTOR DEVICE AND MANUFACTURING METHOD OF THE SAME

TECHNICAL FIELD

The present invention relates to a semiconductor device and a manufacturing method of the same.

BACKGROUND ART

First, a semiconductor device related to the present invention is explained hereinafter with reference to FIG. 8. FIG. 8 schematically illustrates a semiconductor structure of a vertical type GaN field effect transistor (hereinafter called vertical type GaN FET). Note that a vertical type GaN FET shown in FIG. 8 is disclosed in Non patent literature 1, for example.

In the vertical type GaN FET shown in FIG. 8, an n-type GaN layer (102) is formed on a high concentration n-type GaN layer (101). A p-type GaN layer (103) is formed thereon. An n-type GaN layer (104) is formed thereon. A source electrode (111) in ohmic contact is formed thereon. Further, a drain electrode (113) in ohmic contact is formed on the high concentration n-type GaN layer (101) which is exposed by removing a semiconductor layer. Furthermore, a gate electrode (112) is formed on the exposed side of the n-type GaN layer (104) and the p-type GaN layer (103) through a gate insulation film (121).

This vertical type GaN FET shown in FIG. 8 changes an electron concentration accumulated on the interface between the p-type GaN layer (103) and the gate insulation film (121) with a voltage applied to the gate electrode (112). By doing so, a current flowing between the source electrode (111) and the drain electrode (113) is controlled and the vertical type FET is operated.

FIG. 9 is a band energy distribution chart of the vertical type GaN FET shown in FIG. 8. The line between A and B shown in FIG. 9 corresponds to the line between A and B shown in FIG. 8. Further, Vds in FIG. 9 represents a drain voltage. Lch represents the thickness of the p-type GaN layer (103) and Na represents the impurity concentration thereof. Further, Ldr represents the thickness of the n-type GaN layer (102) and Nd represents the impurity concentration thereof. Further, $x_p$ and $x_n$ respectively represent the spread of the depletion layer (depletion layer width) from the pn junction surface of these semiconductor layers. The electrical charge in the depletion layer of the p-type GaN layer (103) and that of the n-type GaN layer (102) are equal. Therefore, the following expression holds.

$$x_p \times Na = x_n \times Nd \quad \text{Expression (1)}$$

The withstanding voltage $V_B$ of the vertical type GaN FET shown in FIG. 8 is designed with the thickness of the n-type GaN layer (102). Namely, when Ecrit represents the breakdown field of GaN, the following expression holds under the conditions in which the n-type GaN layer (102) is completely depleted.

$$V_B = Ecrit \times Ldr \quad \text{Expression (2)}$$

Further, the on-resistance $R_{ON}$ of the vertical type GaN FET in FIG. 8 can be approximately expressed in the following expression.

$$R_{ON} \propto 1/(Lch+Ldr) \quad \text{Expression (3)}$$

FIG. 10 shows the relationship between the withstanding voltage $V_B$ and the on-resistance $R_{ON}$ calculated by the above relational expression of the expression (2) and (3). The horizontal axis in FIG. 10 represents the withstanding voltage $V_B$ (V) and the vertical axis represents the on-resistance $R_{ON}$ (mΩcm$^2$). As shown in FIG. 10, in the region where the withstanding voltage $V_B=10^3$ (V) or higher, the withstanding voltage $V_B$ and the on-resistance $R_{ON}$ decrease at the same time as Ldr decreases. Therefore, the relationship approaches to a GaN theoretical limit. In the region where the withstanding voltage $V_B=10^3$ or lower, the withstanding voltage $V_B$ decreases, whereas Lch stays constant as Ldr decreases. Therefore, the resistance of the p-type GaN layer (103) becomes dominant, and the on-resistance $R_{ON}$ has a constant value. In order to reduce the on-resistance $R_{ON}$ in the region where the withstanding voltage $V_B=10^3$ (V) or lower, the reduction in Lch is effective. However, when the depletion layer in the p-type GaN layer (103) reaches the whole region of the p-type GaN layer (103), a space charge limited current flows because of a punch-through phenomenon and the off-operation cannot be maintained. Namely, in order to maintain the normal switching operation, the relation Lch>xp needs to be satisfied. The lower limit of Lch is determined by the following expression in combination with the expression (1).

$$Lch > xn \times Nd/Na \quad \text{Expression (4)}$$

When the on-resistance $R_{ON}$ of the device is reduced in the semiconductor structure shown in FIG. 8, a punch through phenomenon may occur in the region where the withstanding voltage $V_B=10^3$ or lower. Therefore, there is a limitation in reducing the on-resistance by thinning the p-type GaN layer (103).

Particularly, it is difficult for the p-type GaN layer (103) to have high concentration (about $10^{17}$ cm$^{-3}$). Therefore, the depletion layer width xp of the p-type GaN layer (103) becomes large, and there is a limitation in reducing the on-resistance by thinning the p-type GaN layer (103).

For this reason, the development of a semiconductor device which is capable of suppressing the occurrence of a punch-threw-phenomenon is required.

As a related art document filed prior to the present invention, there is a literature which discloses a technique that enables a small chip size and a high withstanding voltage operation in a field effect transistor using a nitride compound semiconductor (for example, refer to Patent literature 1).

Further, there is a literature which discloses a technique that realizes a buffer layer with a lower resistance in an electric device (element for power electronics) in which a current passes through a SiC substrate and each nitride compound semiconductor layer to operate the electric device (for example, refer to Patent literature 2).

Further, there is a literature which discloses a nitride compound semiconductor that has a lower resistance circuit element and a high operation voltage (for example, refer to Patent literature 3).

Further, there is a literature which discloses a semiconductor circuit element with a lower electric resistance, which includes a mesa part where a polarization caused by the lamination of semiconductor layers is reduced and carriers can smoothly move (for example, refer to Patent literature 4).

[Patent Literature 1]
Japanese Unexamined Patent Application Publication No. 2007-142243
[Patent Literature 2]
Japanese Unexamined Patent Application Publication No. 2007-134517
[Patent Literature 3]
Japanese Unexamined Patent Application Publication No. 2007-59719

[Patent Literature 4]
Japanese Unexamined Patent Application Publication No. 2006-324279
[Non Patent Literature 1]
H. Otake et al. Japanese Journal of Applied Physics, Vol. 46, No. 25, 2007, pp. L599-L601

SUMMARY OF INVENTION

Technical Problem

Patent literatures 1 to 4 described above disclose techniques relating to a semiconductor device including a nitride compound semiconductor layer. However, they neither disclose any technique which can suppress the occurrence of a punch-threw phenomenon described above nor mention its necessity.

The present invention has been made to solve such a problem, and an object thereof is to provide a semiconductor device which is capable of suppressing the occurrence of a punch-through phenomenon and a manufacturing method of the device.

Solution to Problem

In order to achieve the object, the present invention has following features.
<Semiconductor Device>

A semiconductor device according to the present invention including:

a first n-type conductive layer formed on a substrate;

a p-type conductive layer formed on the first n-type conductive layer;

a second n-type conductive layer formed on the p-type conductive layer;

a drain electrode connected to the first n-type conductive layer on an under surface of the substrate;

a source electrode in ohmic contact with the second n-type conductive layer on an upper surface of the substrate; and a gate electrode in contact with the first n-type conductive layer, the p-type conductive layer, and the second n-type conductive layer through an insulation film, in which the gate electrode and the source electrode are alternately arranged, and the p-type conductive layer includes In.

A semiconductor device according to the prevent invention including:

a first n-type conductive layer formed on a substrate;

a p-type conductive layer formed on the first n-type conductive layer;

a second n-type conductive layer formed on the p-type conductive layer;

a drain electrode connected to the first n-type conductive layer on an under surface of the substrate;

a source electrode in ohmic contact with the second n-type conductive layer on an upper surface of the substrate; and a gate electrode in contact with the first n-type conductive layer, the p-type conductive layer, and the second n-type conductive layer through an insulation film, in which the gate electrode and the source electrode are alternately arranged, and the p-type conductive electrode includes a positive polarized charge on a side of the first n-type conductive layer and a negative polarized charge on a side of the second n-type conductive layer.

<Method of Manufacturing a Semiconductor Device>

A method of manufacturing a semiconductor device according to the present invention including:

forming a first n-type conductive layer, a p-type conductive layer, and a second n-type conductive layer on a substrate;

forming a drain electrode connected to the first n-type conductive layer on an under surface of the substrate;

forming a source electrode in ohmic contact with the second n-type conductive layer on an upper surface of the substrate;

connecting a gate electrode to the first n-type conductive layer, the p-type conductive layer, and the second n-type conductive layer through an insulation film; and arranging the gate electrode and the source electrode alternately, in which the p-type conductive layer includes In.

A method of manufacturing a semiconductor device according to the present invention including:

forming a first n-type conductive layer, a p-type conductive layer, and a second n-type conductive layer on a substrate;

forming a drain electrode connected to the first n-type conductive layer on an under surface of the substrate;

forming a source electrode in ohmic contact with the second n-type conductive layer on an upper surface of the substrate;

connecting a gate electrode to the first n-type conductive layer, the p-type conductive layer, and the second n-type conductive layer through an insulation film; and arranging the gate electrode and the source electrode alternately, in which the p-type conductive layer includes a positive polarized charge on a side of the first n-type conductive layer and a negative polarized charge on a side of the second n-type conductive layer.

Advantageous Effects of Invention

According to the present invention, the occurrence of a punch-through phenomenon can be suppressed.

DESCRIPTION OF EMBODIMENTS

<Summary of a Semiconductor Device According to an Exemplary Embodiment of the Present Invention>

First, the outline of a semiconductor device according to an exemplary embodiment of the present invention is explained hereinafter with reference to FIG. 1.

In a semiconductor device according to an exemplary embodiment of the present invention, a first n-type conductive layer (2') is formed on a substrate (1'). A p-type conductive layer (3') is formed thereon. A second n-type conductive layer (4') is formed thereon. On the under surface of the substrate (1'), there is a drain electrode (13') connected to the first n-type conductive layer (2'). On the upper surface of the substrate (1'), there is a source electrode (11') in ohmic contact with the second n-type conductive layer (4'), and a gate electrode (12') in contact with the first n-type conductive layer (2'), the p-type conductive layer (3'), and the second n-type conductive layer (4') through an insulation film (21'). The gate electrode (12') and the source electrode (11') are alternately arranged. The p-type conductive layer (3') includes In. This makes it possible for the p-type conductive layer (3') to have high concentration and the occurrence of a punch-through phenomenon can be suppressed.

Further, in the semiconductor device according to the exemplary embodiment of the present invention, a first n-type conductive layer (2') is formed on a substrate (1'). A p-type conductive layer (3') is formed thereon. A second n-type conductive layer (4') is formed thereon. On the under surface of the substrate (1'), there is a drain electrode (13') connected to the first n-type conductive layer (2'). On the upper surface of the substrate (1'), there is a source electrode (11') in ohmic contact with the second n-type conductive layer (4'), and a gate electrode (12') in contact with the first n-type conductive layer (2'), the p-type conductive layer (3'), and the second n-type conductive layer (4') through an insulation film (21'). The gate electrode (12') and the source electrode (11') are alternately arranged. The p-type conductive layer (3') includes a positive polarized charge on the side of the first n-type conductive layer (2'), and a negative polarized charge on the side of the second n-type conductive layer (4').

Accordingly, in the semiconductor device according to the exemplary embodiment, the polarized charge of the p-type conductive layer (3') raises a band energy to suppress the spread of the depletion layer which is caused by applying a drain electrode. Therefore, the occurrence of a punch-through phenomenon can be suppressed. Hereinafter with reference to the attached figures, the semiconductor device according to the exemplary embodiment is explained in detail.

Embodiment 1
<Structure of a Semiconductor Device>

First, a structure of a semiconductor device according to the exemplary embodiment is explained with reference to FIG. 2. Note that FIG. 2 schematically illustrates a semiconductor structure in a vertical type GaN FET which serves as a semiconductor device according to the exemplary embodiment.

In the vertical type GaN FET according to the exemplary embodiment, an n-type GaN layer (2), a p-type InGaN layer (3), an n-type GaN layer (4) are sequentially formed on an n-type substrate (1) composed of such as Si. Further, a drain electrode (13) in ohmic contact is formed under the n-type substrate (1). Further, a source electrode (11) in ohmic contact is formed on the n-type GaN layer (4). Further, there is a gate electrode (12) in contact with the n-type GaN layer (4), the p-type InGaN layer (3), and the n-type GaN layer (2) through a gate insulation film (21). In the vertical type FET of the exemplary embodiment, the gate electrode (12) and the source electrode (11) are alternatively arranged in the planar direction.

FIG. 3 is a band energy distribution chart of the vertical GaN FET according to the exemplary embodiment. The line between A and B shown in FIG. 3 corresponds to the line between A and B shown in FIG. 2. Further, Vds shown in FIG. 3 represents a drain voltage. In the vertical GaN FET of the exemplary embodiment, by forming the p-type InGaN layer (3) on the n-type GaN layer (2), a positive polarized charge (+) is generated on the under interface of the p-type InGaN layer (3) and a negative polarized charge (−) is generated on the upper interface thereof. When Np represents this polarized charge density, the thickness Lch of the p-type InGaN layer is expressed by the following expression (5) under the conditions in which the suppression of a punch-through phenomenon is considered.

$$Lch > (x_n \times Nd - Np)/Na \qquad \text{Expression (5)}$$

In the above expression, Nd represents the impurity concentration of the n-type GaN layer (2). Na represents the impurity concentration of the p-type InGaN layer (3). $x_n$ represents the depletion layer width of the n-type GaN layer (2).

In the vertical type GaN FET according to the exemplary embodiment, the polarized charge generated in the p-type conductive layer (3) can raise a band energy to suppress the spread of the depletion layer which is caused by applying a drain voltage. This makes it possible to thin the p-type InGaN layer (3) with suppressing the occurrence of a punch-through phenomenon.

Accordingly, in the vertical type GaN FET according to the exemplary embodiment, the p-type InGaN layer (3) can be thinned compared to the semiconductor device shown in FIG. 8 related to the present invention. Therefore, the reduction of the on-resistance can be realized. Further, the vertical type GaN FET according to the exemplary embodiment has high impurity concentration because of including the p-type InGaN layer (3) where In is applied to the p-type layer. Therefore, the p-type InGaN layer (3) can be thinned and the reduction of the on-resistance can be realized with suppressing the occurrence of a punch-through phenomenon.

<Method of Manufacturing a Semiconductor Device>

Next, a vertical type GaN FET which serves as a semiconductor device of the exemplary embodiment is explained hereinafter.

First, a semiconductor layer is formed on the n-type substrate (1) composed of conductive Si by Molecular Beam Epitaxy (MBE) growth method, for example. In the semiconductor layer formed by this method, an n-type GaN drift layer (2) (film thickness 1 mm, doping concentration $1 \times 10^{17}$ cm$^{-3}$), a p-type $In_{0.2}Ga_{0.8}N$ channel layer (3) (film thickness 0.1 mm, doping concentration $5 \times 10^{18}$ cm$^{-3}$), and an n-type GaN cap layer (4) (film thickness 0.1 mm, doping concentration $5 \times 10^{17}$ cm$^{-3}$) are sequentially formed from the side of the n-type substrate (1).

Next, at the bottom of the n-type substrate (1) and at the top of the n-type GaN layer (4), a metal such as Ti/Al is deposed to form a source electrode (11) and a drain electrode (13). Further, an anneal at 650° C. is performed to make ohmic contact.

Furthermore, a part of an epitaxial layer structure (2, 3, and 4) is removed by etching until the n-type GaN drift layer (2) is exposed. For example, a metal such as Ni/Au is deposited to form a gate electrode (12) after forming $Al_2O_3$ as a gate insulation film (21). By doing so, the vertical type GaN FET shown in FIG. 2 is manufactured.

Note that the vertical GaN FET described above is an example. The configuration of an ohmic electrode is not limited to the configuration described above but various configurations are applicable. For example, in the exemplary embodiment described above, the source electrode (11) is formed on the upper part of the n-type GaN layer (4). However, it is possible to form the n-type conductivity on a part of the p-type InGaN layer (3) by ion implantation and so on, and to form the source electrode (11) in contact with both the n-type region and the p-type region. Further, in the exemplary embodiment described above, the drain electrode (13) is formed on the back surface of the n-type substrate (1). However, the drain electrode (13) can be formed to contact to the n-type GaN layer (2) by a via-hole.

In the p-type InGaN layer (3) of the vertical type GaN FET described above, a positive polarized charge is generated on the side of the n-type GaN layer (2) and a negative polarized charge is generated on the side of the n-type GaN layer (4) as shown in FIGS. 2 and 3. If a polarized charge can be generated in the p-type InGaN layer (3), the composition of the n-type GaN layer (2 and 4) and that of the p-type InGaN layer (3) are not particularly limited but various composition can be applied to these layers.

Furthermore, the composition of each layer (2 to 4) included in the vertical type GaN FET described above is not limited to the exemplary embodiment described above. For example, it is possible to form the n-type GaN layer (2) shown in FIGS. 2 and 3 with $Al_xGa_{1-x}N$ ($0 \leq x \leq 1$), form the p-type InGaN layer (3) with $In_yGa_{1-y}N$ (0<y≦1) and form the n-type GaN layer (4) with $Al_zGa_{1-z}N$ (0≦z≦1).

Embodiment 2

Next, the second exemplary embodiment is explained hereinafter.

In the first exemplary embodiment, the n-type GaN layer (2) and the p-type InGaN layer (3) is formed from different compositions, and a positive polarized charge (+) is generated on the under interface of the p-type InGaN layer (3) and a negative polarized charge (−) is generated on the upper interface thereof. Therefore, the polarized charge generated in the p-type InGaN layer (3) raises a band energy. This makes it possible to thin the p-type InGaN layer (3) with suppressing the occurrence of a punch-through phenomenon.

In the second exemplary embodiment, as shown in FIG. 4, the n-type InGaN (5) and the p-type InGaN layer (3) are formed from the same composition. It is thereby possible to prevent notches from being formed on the boundary surface between the n-type InGaN layer (5) and the p-type InGaN layer (3). Hereinafter, with reference to FIG. 4 and FIG. 5, the second exemplary embodiment is explained in detail.

<Structure of a Semiconductor Device>

First, the semiconductor device structure according to the exemplary embodiment is explained with reference to FIG. 4. Note that FIG. 4 schematically illustrates a semiconductor structure in a vertical type GaN FET which serves as a semiconductor device according to the exemplary embodiment.

In the vertical type GaN FET according to the exemplary embodiment, an n-type InGaN layer (5), a p-type InGaN layer (3), and an n-type GaN layer (4) are sequentially formed on an n-type substrate (1) composed of such as Si. A drain electrode (13) in ohmic contact is formed under the n-type substrate (1). A source electrode (11) in ohmic contact is formed on the n-type GaN layer (4). There is a gate electrode (12) in contact with the n-type GaN layer (4), the p-type InGaN layer (3), and the InGaN layer (5) through a gate insulation film (21). In the vertical type FET of the exemplary embodiment, the gate electrode (12) and the source electrode (11) are alternatively arranged in the planar direction.

FIG. 5 is a band energy distribution chart of the vertical GaN FET according to the exemplary embodiment. In the structure of the vertical GaN FET according to the exemplary embodiment, the n-type InGaN layer (5) and that of the p-type InGaN layer (3) are formed from the same composition. Therefore, it is impossible to obtain the suppression effect of a punch-through phenomenon by the polarized charge generated in the p-type InGaN layer (3) unlike the first exemplary embodiment. However, in the structure of the vertical GaN FET according to the exemplary embodiment, notches are not formed on the boundary surface between the n-type InGaN layer (5) and the p-type InGaN layer (3). This realizes the lower resistance. Further, because of including the p-type InGaN layer (3) where In is applied to the p-type layer, it is possible to have high concentration. Therefore, the p-type InGaN layer (3) can be thinned and the on-resistance can be reduced with suppressing the occurrence of a punch-through phenomenon.

<Method of Manufacturing a Semiconductor Device>

Next, a vertical type GaN FET of the exemplary embodiment is explained hereinafter.

First, a semiconductor layer is formed on the n-type substrate (1) including an electrical conductive Si by Molecular beam Epitaxy (MBE) growth method, for example. In the semiconductor layer formed by this method, an n-type $In_{0.2}GaN$ drift layer (5) (film thickness 1 mm, doping concentration $1\times10^{17}$ cm$^{-3}$), a p-type $In_{0.2}Ga_{0.8}N$ channel layer (3) (film thickness 0.1 mm, doping concentration $5\times10^{18}$ cm$^{-3}$), and an n-type GaN cap layer (4) (film thickness 0.1 mm, doping concentration $5\times10^{17}$ cm$^{-3}$) are sequentially formed from the side of the n-type substrate (1).

Next, at the bottom of the n-type substrate (1) and at the top of the n-type GaN layer (4), a metal such as Ti/Al is deposed to form a source electrode (11) and a drain electrode (13). Further, an anneal at 650° C. is performed to make ohmic contact.

Furthermore, a part of an epitaxial layer structure (5, 3, and 4) is removed by etching until the n-type InGaN drift layer (5) is exposed. For example, a metal such as Ni/Au is deposited to form a gate electrode (12) after forming $Al_2O_3$ as a gate insulation film (21). By doing so, the vertical type GaN FET shown in FIG. 4 is manufactured.

Note that the vertical GaN FET described above is an example. The configuration of an ohmic electrode is not limited to the configuration described above but various configurations are applicable. For example, in the exemplary embodiment described above, the source electrode (11) is formed on the upper part of the n-type GaN layer (4). However, it is possible to form the n-type conductivity on a part of the p-type InGaN layer (3) by ion implantation and so on, and to form the source electrode (11) in contact with both the n-type region and the p-type region. Further, in the exemplary embodiment described above, the drain electrode (13) is formed on the back surface of the n-type substrate (1). However, the drain electrode (13) can be formed to contact to the n-type InGaN layer (5) by a via-hole.

Furthermore, the composition of each layer (3 to 5) included in the vertical type GaN FET described above is not limited to the exemplary embodiment described above. For example, it is possible to form the n-type InGaN layer (5) and the p-type InGaN layer (3) shown in FIG. 4 and FIG. 5 with $In_yGa_{1-y}N$ (0≦y≦1) and form the n-type GaN layer (4) with $Al_zGa_{1-z}N$ (0≦z≦1).

Embodiment 3

Next, the third exemplary embodiment is explained hereinafter.

In the second exemplary embodiment, as shown in FIG. 4, the n-type InGaN layer (5) and the p-type InGaN layer (3) are formed from the same composition to prevent notches from being, formed on the boundary surface between the n-type InGaN layer (5) and the p-type InGaN layer (3).

In the third exemplary embodiment, as shown in FIG. 6, a composition modulation layer (6) where the composition is continuously or gradually changed is formed between the n-type GaN layer (2) and the p-type InGaN layer (3). This makes it possible to provide the suppression effect of a punch-through phenomenon by the polarized charge generated in the p-type InGaN layer (3) in a manner similar to the first exemplary embodiment. Further, it is possible to prevent notches from being formed between the n-type GaN layer (2) and the p-type InGaN layer (3). Hereinafter, with reference to FIG. 6 and FIG. 7, the third exemplary embodiment is explained in detail.

<Structure of a Semiconductor Device>

First, the semiconductor device structure according to the exemplary embodiment is explained with reference to FIG. 6. Note that FIG. 6 schematically illustrates a semiconductor structure in a vertical type GaN FET which serves as a semiconductor device according to the exemplary embodiment.

The vertical GaN FET of the exemplary embodiment has a structure where the composition modulation layer (6) is inserted between the n-type GaN layer (2) and the p-type InGaN layer (3) in the vertical GaN FET of the first exemplary embodiment. The composition modulation layer (6) is a layer where a composition is continuously and gradually changed. FIG. 6 shows the structure where the n-type composition modulation layer (6) is inserted.

FIG. 7 is a band energy distribution chart of the vertical GaN FET according to the exemplary embodiment. The total of the positive polarized charge generated in the n-type composition modulation layer (6) and that of the p-type InGaN layer (3) are equal. This makes it possible to provide the suppression effect of a punch-through phenomenon by the polarized electrode generated in the p-type InGaN layer (3) as well as the first exemplary embodiment. Further, in the vertical GaN FET according to the exemplary embodiment, notched are not formed between the p-type InGaN layer (3) and the n-type GaN layer (2) because the n-type composition modulation layer (6) is inserted. Therefore, it is possible to reduce the resistance compared to the first exemplary embodiment.

<Method of Manufacturing a Semiconductor Device>

Next, a vertical type GaN FET of the exemplary embodiment is explained hereinafter.

First, a semiconductor layer is formed on the n-type substrate (1) composed of conductive Si by Molecular beam Epitaxy (MBE) growth method, for example. In the semiconductor layer formed by this method, an n-type GaN drift layer (2) (film thickness 1 mm, doping concentration $1 \times 10^{17}$ cm$^{-3}$), an n-type composition modulation layer (6) (film thickness 50 nm, doping concentration $1 \times 10^{17}$ cm$^{-3}$), a p-type In$_{0.2}$Ga$_{0.8}$N channel layer (3) (film thickness 0.1 mm, doping concentration $5 \times 10^{18}$ cm$^{-3}$), and an n-type GaN cap layer (4) (film thickness 0.1 mm, doping concentration $5 \times 10^{17}$ cm$^{-3}$) are sequentially formed from the side of the n-type substrate (1).

Next, at the bottom of the n-type substrate (1) and at the top of the n-type GaN layer (4), a metal such as Ti/Al is deposited to form a source electrode (11) and a drain electrode (13). Further, an anneal at 650° C. is performed to make ohmic contact.

Furthermore, a part of an epitaxial layer structure (2, 6, 3, and 4) is removed by etching until the n-type GaN drift layer (2) is exposed. For example, a metal such as Ni/Au is deposited to form a gate electrode (12) after forming Al$_2$O$_3$ as a gate insulation film (21). By doing so, the vertical type GaN FET shown in FIG. 6 is manufactured.

Note that the vertical GaN FET described above is an example. The configuration of an ohmic electrode is not limited to the configuration described above but various configurations are applicable. For example, in the exemplary embodiment described above, the source electrode (11) is formed on the upper part of the n-type GaN layer (4). However, it is possible to form the n-type conductivity on a part of the p-type InGaN layer (3) by ion implantation and so on, and to form the source electrode (11) in contact with both the n-type region and p-type region. Further, in the exemplary embodiment described above, the drain electrode (13), is formed on the back surface of the n-type substrate (1), can be formed to contact to the n-type InGaN layer (5) by a via-hole. In the exemplary embodiment described above, the composition modulation layer (6) is an n-type composition modulation layer. However, the same effect is obtained even when the composition modulation layer (6) is a p-type composition modulation layer.

Advantage Effects of Invention

As is obvious from the above explanation, a semiconductor device of the exemplary embodiment has the following features.

In a semiconductor device according to an exemplary embodiment, a first n-type conductive layer (2 or 5) is formed on a substrate (1). A p-type conductive layer (3) is formed thereon. A second n-type conductive layer (4) is formed thereon. On the under surface of the substrate (1), there is a drain electrode (13) connected to the first n-type conductive layer (2 or 5). On the upper surface of the substrate (1), there is a source electrode (11) in ohmic contact with the second n-type conductive layer (4), and a gate electrode (12) in contact with the first n-type conductive layer (2 or 5), the p-type conductive layer (3), and the second n-type conductive layer (4) through an insulation film (21). The gate electrode (12) and the source electrode (11) are alternately arranged. The p-type conductive layer (3) includes In.

In a semiconductor device according to the exemplary embodiment, as shown in FIG. 2 and FIG. 3, the p-type conductive layer (3) has a positive polarized charge on the side of the first n-type conductive layer (2) and a negative polarized charge on the side of the second n-type conductive layer (4). Further, in the semiconductor device according to the exemplary embodiment, the first n-type conductive layer (2) and the p-type conductive layer (3) are formed from different compositions. Further, in the semiconductor device according to the exemplary embodiment, the composition of the first n-type conductive layer (2) includes Al$_x$Ga$_{1-N}$ ($0 \leq x \leq 1$) and that of the p-type conductive layer (3) includes In$_y$Ga$_{1-y}$N ($0 \leq y \leq 1$).

Further, in the semiconductor device according to the exemplary embodiment, as shown in FIG. 4 and FIG. 5, the first n-type conductive layer (5) and the p-type conductive layer (3) are formed from the same composition. Further, in the semiconductor device according to the exemplary embodiment, the compositions of the first n-type conductive layer (5) and that of the p-type conductive layer (3) include In$_y$Ga$_{1-y}$N ($0 < y \leq 1$).

Further, in the semiconductor device according to the exemplary embodiment, as shown in FIG. 6 and FIG. 7, a composition modulation layer (6) where the composition is continuously or gradually changed is formed between the first n-type conductive layer (2) and the p-type conductive layer (3). Further, in the semiconductor device according to the exemplary embodiment, the composition modulation layer (6) is an n-type composition modulation layer or a p-type composition modulation layer.

Further, in the semiconductor device according to the exemplary embodiment, the expression Lch>Ldr×Nd/Na is satisfied, where Lch represents the thickness of the p-type conductive layer (3), Na represents the impurity concentration thereof, Ldr represents the thickness of the first n-type conductive layer (2 or 5), and Nd represents the impurity concentration thereof.

Further, in the semiconductor device according to the exemplary embodiment, the expression Lch>(Ldr×Nd−Np) is satisfied, where Lch represents the thickness of the p-type conductive layer (3), Na represents the impurity concentration thereof, Ldr represents the thickness of the first n-type conductive layer (2), Nd represents the impurity concentration thereof, and Np represents the polarized charge density of the p-type conductive layer (3).

In the semiconductor device according to the exemplary embodiment described above, it is realized to provide the vertical GaN FET which can suppress the occurrence of a punch-through phenomenon and can have the low on-resistance in the low withstanding voltage region.

Note that the exemplary embodiments described above are the preferable exemplary embodiments. The scope of the present invention is not limited to the exemplary embodiment described above but various modifications can be made without departing from the spirit and the scope of the present invention.

This application is based upon and claims the benefit of priority from Japanese patent application No. 2008-076729, filed on Mar. 24, 2008, the disclosure of which is incorporated herein in its entirety by reference.

Industrial Applicability

This invention can be applied to a vertical GaN FET.

EXPLANATION OF REFERENCE

Figure 1:
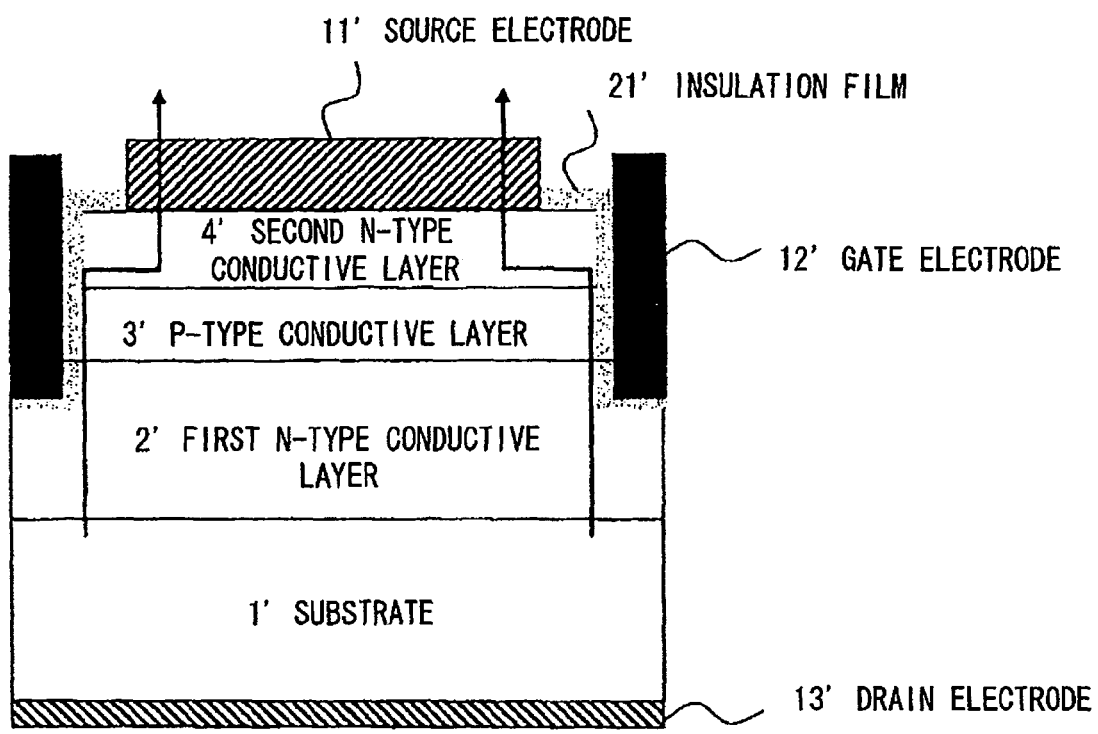
FIG. 1 is a view illustrating the outline of the semiconductor device according to the exemplary embodiment of the present invention.
Figure 2:
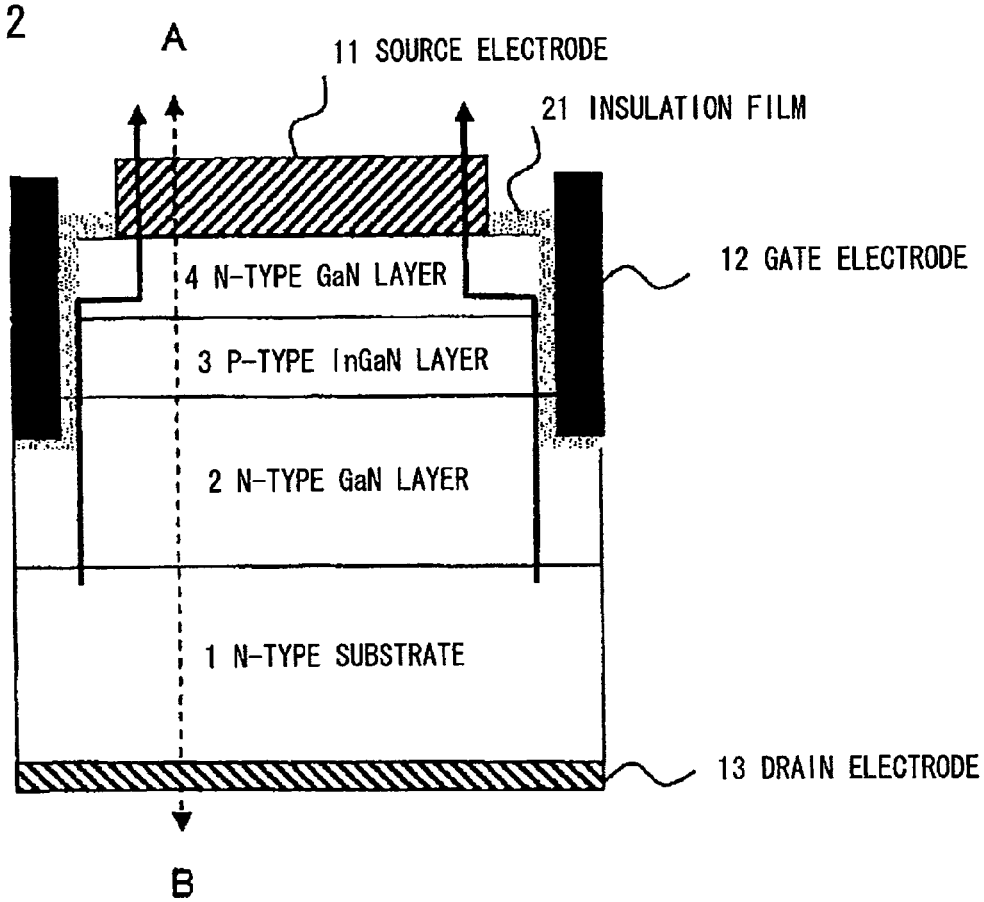
FIG. 2 is a view showing an example of the semiconductor device structure according to the first exemplary embodiment.
Figure 3:
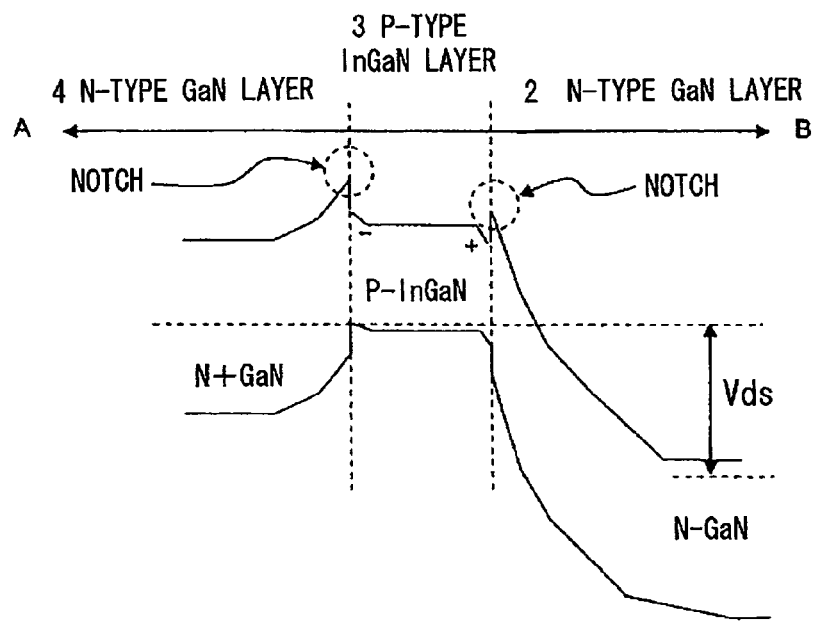
FIG. 3 is a band energy distribution chart of the semiconductor device according to the first exemplary embodiment.
Figure 4:
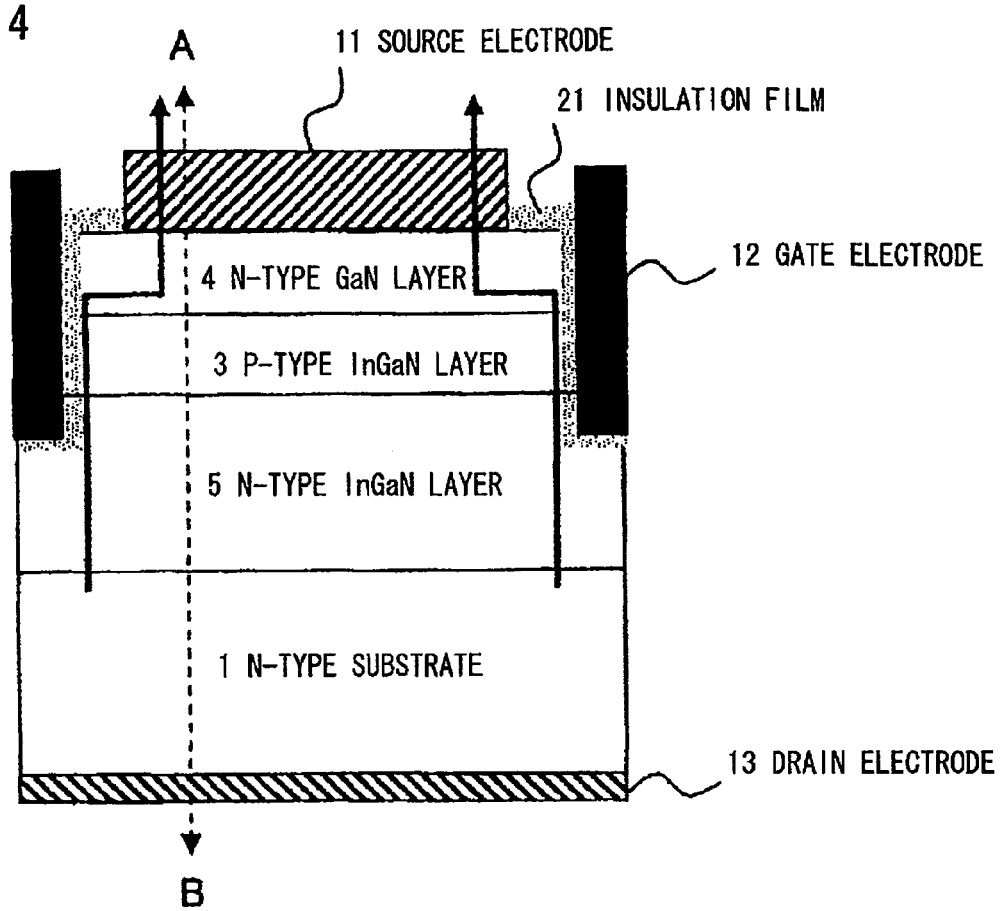
FIG. 4 is a view showing an example of the semiconductor device structure according to the second exemplary embodiment.
Figure 5:
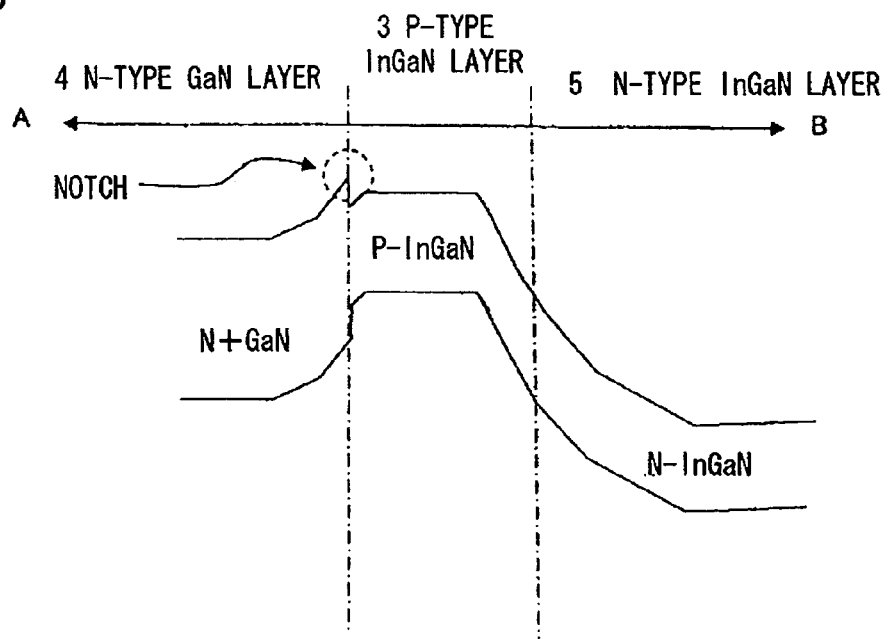
FIG. 5 is a band energy distribution chart of the semiconductor device according to the second exemplary embodiment.
Figure 6:
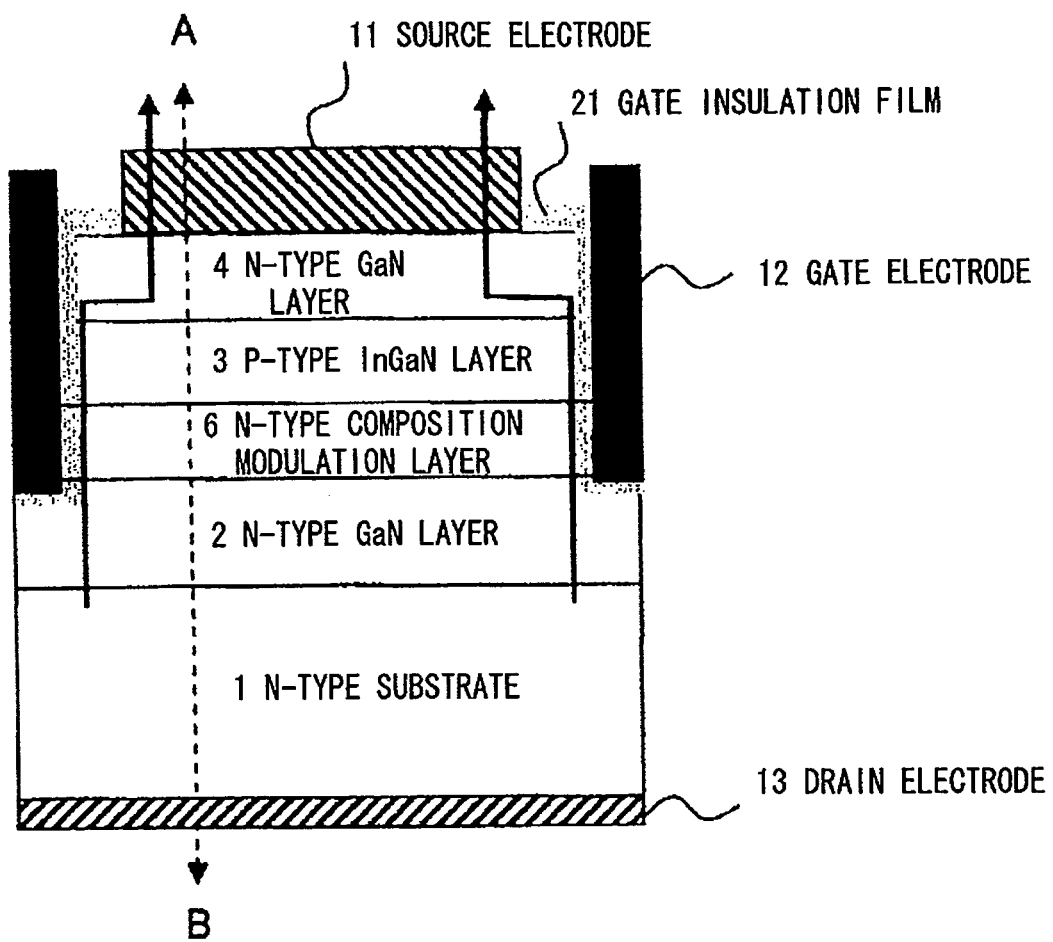
FIG. 6 is a view showing an example of the semiconductor device structure according to the third exemplary embodiment.
Figure 7:
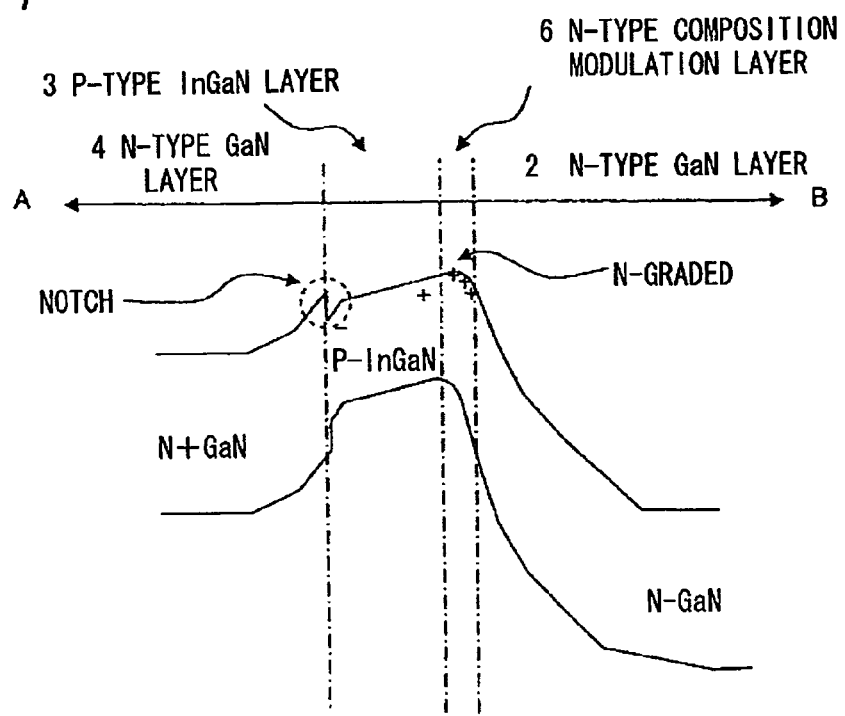
FIG. 7 is a band energy distribution chart of the semiconductor device according to the third exemplary embodiment.
Figure 8:
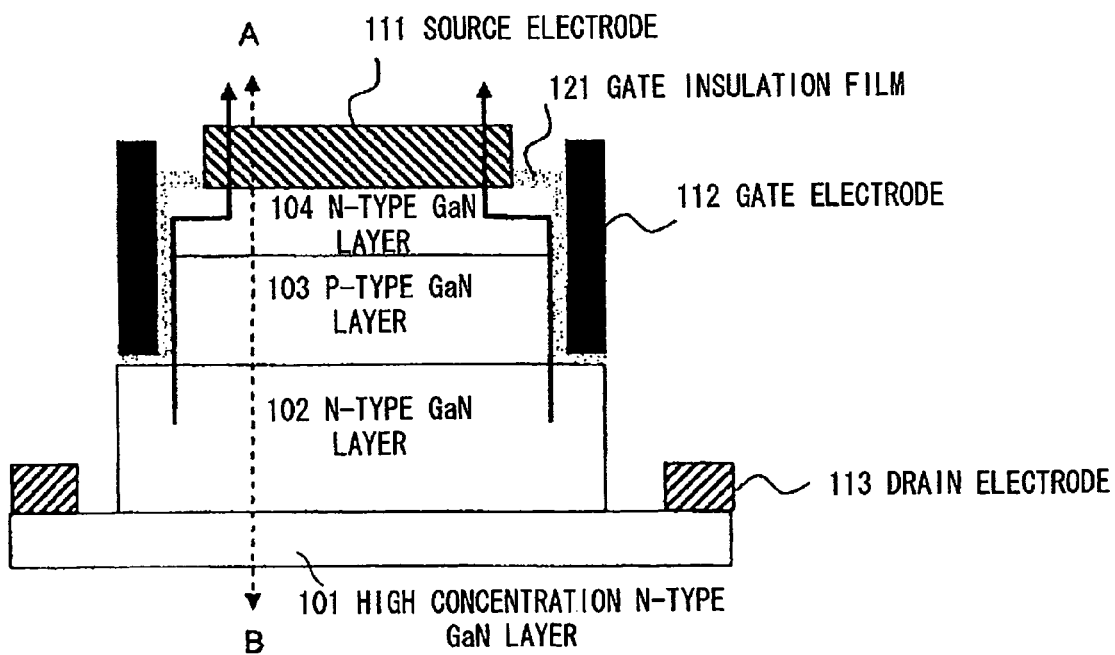
FIG. 8 is a view showing an example of the semiconductor device structure related to the present invention.
Figure 9:
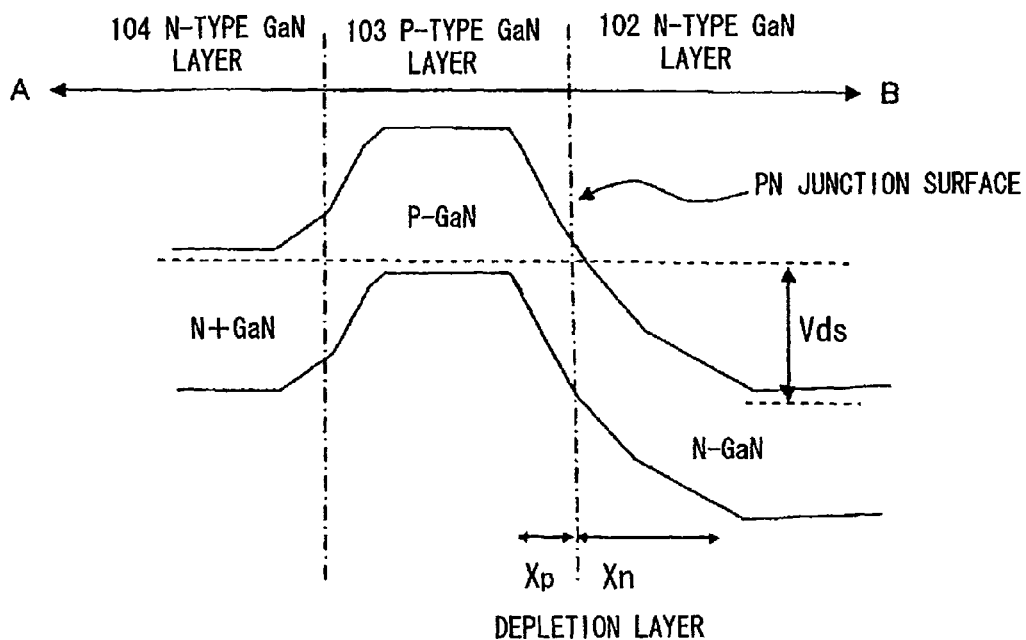
FIG. 9 is a band energy distribution chart of a semiconductor device related to the present invention.
Figure 10:
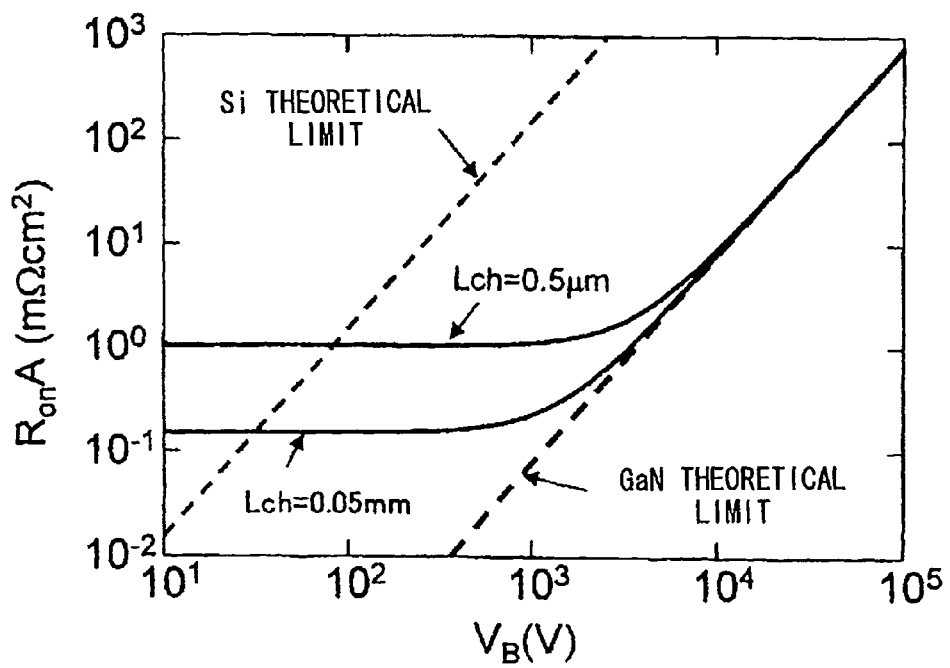
FIG. 10 is a view showing the predicted result by calculation of the relationship between the withstanding $V_B$ and the on-resistance pressure $R_{ON}$ of the vertical GaN FET.

1' substrate
2' first n-type conductive layer
3' p-type conductive layer
4' second conductive layer
11' source electrode
12' gate electrode
13' drain electrode
21' insulation film
1 n-type substrate
2 n-type GaN layer (n-type GaN drift layer)
3 p-type InGaN layer (p-type InGaN channel layer)
4 n-type GaN layer (n-type GaN cap layer)
5 n-type InGaN layer (n-type InGaN drift layer)
6 composition modulation layer
11 source electrode
12 gate electrode
13 drain electrode
21 gate insulation film
101 high concentration n-type GaN layer
102 n-type GaN layer
103 p-type GaN layer (p-type GaN channel layer)
104 n-type GaN layer (n-type GaN cap layer)
111 source electrode
112 gate electrode
113 drain electrode
121 gate insulation film

The invention claimed is:

1. A semiconductor device comprising:
a first n-type conductive layer formed on a substrate;
a p-type conductive layer formed on the first n-type conductive layer;
a second n-type conductive layer formed on the p-type conductive layer;
a drain electrode connected to the first n-type conductive layer on an under surface of the substrate;
a source electrode in ohmic contact with the second n-type conductive layer on an upper surface of the substrate; and
a gate electrode in contact with the first n-type conductive layer, the p-type conductive layer, and the second n-type conductive layer through an insulation film, wherein
the gate electrode and the source electrode are alternately arranged,
the p-type conductive layer and the first n-type conductive layer each comprise $In_yGa_{1-y}N$ ($0<y\leq1$), and
the second n-type conductive layer comprises $Al_xGa_{1-x}N$ ($0<x\leq1$), which is different from the p-type conductive layer and the first n-type conductive layer.

2. The semiconductor device according to claim 1, wherein an expression Lch>Ldr×Nd/Na is satisfied, where Lch is a thickness of the p-type conductive layer, Na is an impurity concentration thereof, Ldr is a thickness of the first n-type conductive layer, and Nd is an impurity concentration thereof.

3. A method of manufacturing a semiconductor device, the method comprising:
forming a first n-type conductive layer, a p-type conductive layer, and a second n-type conductive layer on a substrate;
forming a drain electrode connected to the first n-type conductive layer on an under surface of the substrate;
forming a source electrode in ohmic contact with the second n-type conductive layer on an upper surface of the substrate;
connecting a gate electrode to the first n-type conductive layer, the p-type conductive layer, and the second n-type conductive layer through an insulation film; and
arranging the gate electrode and the source electrode alternately, wherein
the p-type conductive layer and the first n-type conductive layer each comprise $In_yGa_{1-y}N$ ($0<y\leq1$), and
the second n-type conductive layer comprises $Al_xGa_{1-x}N$ ($0<x\leq1$), which is different from the p-type conductive layer and the first n-type conductive layer.

4. The method according to claim 3, wherein the forming of the p-type conductive layer comprises forming the p-type conductive layer to have a thickness Lch and an impurity concentration of Na,
the forming of the first n-type conductive layer comprises forming the first n-type conductive layer to have a thickness Ldr and an impurity concentration of Nd, and
wherein Lch>Ldr×Nd/Na.

5. A semiconductor device comprising:
a substrate;
a first conductive layer having a first conductivity type and comprising a material including a nitride of a first type;
a second conductive layer having a second conductivity type, the second conductive layer being formed on the first conductive layer;
a third conductive layer having the first conductivity type and comprising a material including a nitride of a second type, the third conductive layer being formed on the second conductive layer;
a drain electrode connected to the first conductive layer on a first surface of the substrate;
a source electrode in ohmic contact with the third conductive layer on a second surface of the substrate; and
a gate electrode in contact with the first conductive layer, the second conductive layer, and the third conductive layer through an insulation film, the gate electrode is alternately arranged with the source electrode.

6. The semiconductor device according to claim 5, wherein the second conductive layer comprises a material including the nitride of the first type.

7. The semiconductor device according to claim 5, wherein the nitride of the first type comprises $In_y Ga_{1-y} N$ ($0<y\leq 1$), and the nitride of the second type comprises $Al_x Ga_{1-x} N$ ($0<x\leq 1$).

8. The semiconductor device according to claim 7, wherein the second conductive layer comprises a material including the nitride of the first type.

9. The semiconductor device according to claim 5, wherein the first conductivity type comprises an n-type material, and the second conductivity type comprises a p-type material.

10. The semiconductor device according to claim 5, wherein the substrate has the first conductivity type.

* * * * *